(12) United States Patent
Kumazaki et al.

(10) Patent No.: US 10,360,981 B2
(45) Date of Patent: Jul. 23, 2019

(54) SEMICONDUCTOR MEMORY DEVICE FOR PROVIDING DIFFERENT VOLTAGES TO GROUPED MEMORY BLOCKS

(71) Applicant: Toshiba Memory Corporation, Tokyo (JP)

(72) Inventors: Noriyasu Kumazaki, Kawasaki Kanagawa (JP); Koji Kato, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,843

(22) Filed: Sep. 3, 2017

(65) Prior Publication Data

US 2018/0277217 A1    Sep. 27, 2018

(30) Foreign Application Priority Data

Mar. 24, 2017    (JP) .................................. 2017-059207

(51) Int. Cl.
*G06F 11/10* (2006.01)
*G11C 16/04* (2006.01)
*G11C 16/08* (2006.01)

(52) U.S. Cl.
CPC .......... *G11C 16/08* (2013.01); *G06F 11/1048* (2013.01); *G11C 16/0483* (2013.01)

(58) Field of Classification Search
CPC ....... G11C 16/08; G11C 8/08; G11C 16/0483; G06F 11/10
See application file for complete search history.

(56) References Cited

U.S. PATENT DOCUMENTS

| 6,459,642 | B1 | 10/2002 | Cho et al. | |
|---|---|---|---|---|
| 8,526,241 | B2 | 9/2013 | Shirakawa | |
| 10,032,524 | B2* | 7/2018 | Sabde | G11C 29/50 |
| 2001/0012216 | A1* | 8/2001 | Taura | G11C 29/78 365/185.09 |
| 2014/0247658 | A1* | 9/2014 | Hosono | G11C 16/24 365/185.11 |
| 2016/0118123 | A1* | 4/2016 | Jung | G11C 16/10 365/185.11 |

FOREIGN PATENT DOCUMENTS

| JP | 2003217293 A | 7/2003 |
|---|---|---|
| JP | 2006-196668 A | 7/2006 |

* cited by examiner

*Primary Examiner* — Jerome Leboeuf
(74) *Attorney, Agent, or Firm* — Kim & Stewart LLP

(57) ABSTRACT

A semiconductor memory device includes a plurality of blocks of memory cells, including first, second, and third blocks of a first group of blocks and fourth fifth and sixth blocks of a second group of blocks, a plurality of word lines for each of the blocks, a first decode circuit for the first group, and a second decode circuit for the second group. When the first block is selected, the first decode circuit transfers a first voltage to the word lines of the first block, transfers a second voltage lower than the first voltage to the word lines of the second block, and causes the word lines of the third block to go into an electrically floating state, and the second decode circuit causes the words lines of the fourth block, the fifth block, and the sixth block into the electrically floating state.

6 Claims, 15 Drawing Sheets

US 10,360,981 B2

SEMICONDUCTOR MEMORY DEVICE FOR PROVIDING DIFFERENT VOLTAGES TO GROUPED MEMORY BLOCKS

CROSS-REFERENCE TO RELATED APPLICATION

This application is based upon and claims the benefit of priority from Japanese Patent Application No. 2017-059207, filed Mar. 24, 2017, the entire contents of which are incorporated herein by reference.

FIELD

Embodiments described herein relate generally to a semiconductor memory device.

BACKGROUND

A NAND flash memory is known as a semiconductor memory device.

DETAILED DESCRIPTION

Figure 1:
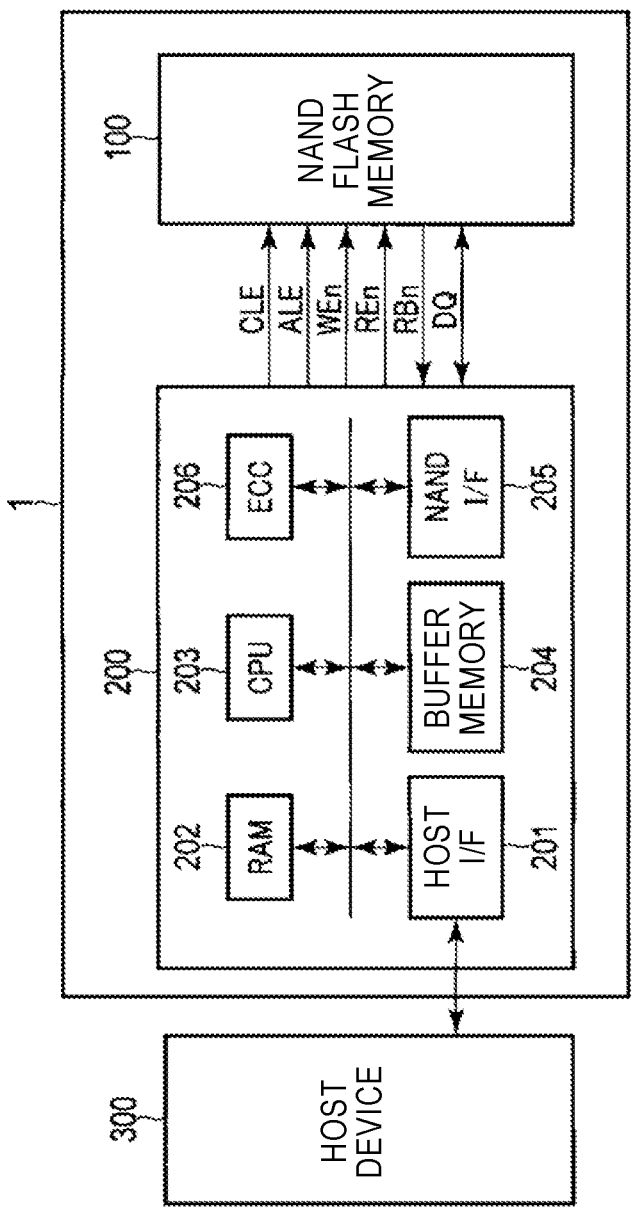
FIG. 1 is a view illustrating a configuration of a memory system including a semiconductor memory device.

Embodiments provide a semiconductor memory device in which operation reliability may be improved.

In general, according to one embodiment, the semiconductor memory device includes a plurality of blocks of memory cells, including first, second, and third blocks of a first group of blocks and fourth fifth and sixth blocks of a second group of blocks, a plurality of word lines for each of the blocks, a first decode circuit for the first group, and a second decode circuit for the second group. When the first block is selected, the first decode circuit transfers a first voltage to the word lines of the first block, transfers a second voltage lower than the first voltage to the word lines of the second block, and causes the word lines of the third block to go into an electrically floating state, and the second decode circuit causes the words lines of the fourth block, the fifth block, and the sixth block into the electrically floating state.

Hereinafter, embodiments will be described with reference to the accompanying drawings. In the following descriptions, substantially similar components are denoted by the same reference numerals/symbols a detailed description of these components will be omitted. Numerals after a same reference will be used to differentiate among substantially similar components. When substantially similar components indicated by the same reference symbol are not differentiated, the components will be referred to by the reference symbol alone. For example, when two substantially similar components denoted by a reference symbol and subsequent numerals, BLK<0> and BLK<1>, are not differentiated, the two components will be collectively referred to by the reference symbol BLK.

First Embodiment

A semiconductor memory device according to a first embodiment will be described. In the following descriptions, an example of the semiconductor memory device is a three-dimensionally stacked NAND flash memory in which memory cell transistors are stacked on a semiconductor substrate.

<1-1> Configuration of Memory System

First, a configuration of a memory system including the semiconductor memory device according to the first embodiment will be described using FIG. 1.

As illustrated in FIG. 1, a memory system 1 includes a NAND flash memory 100 and a memory controller 200. For example, the combination of the memory controller 200 and the NAND flash memory 100 may constitute one semiconductor device, and examples of this combination are a memory card such as an SDTM card, a solid-state drive (SSD) and others. The memory system 1 may further include a host device 300. In addition, the memory system 1 may be a memory system in which a plurality of NAND chips and a NAND I/F are stacked and connected to each other using a through silicon via (TSV). The NAND flash memory 100 includes a plurality of memory cell transistors that store data in a nonvolatile manner. Details of the configuration of the NAND flash memory 100 will be described later.

The memory controller 200 commands the NAND flash memory 100 to perform read, write, erase and the like in response to a command from the host device 300.

The memory controller 200 includes a host interface (I/F) circuit 201, an internal memory (RAM) 202, a processor (CPU) 203, a buffer memory 204, a NAND interface (I/F) circuit 205, and an error-correcting code (ECC) circuit 206.

The host interface (I/F) circuit 201 is connected to the host device 300 via a controller bus, and controls a communication between the memory controller 200 and the host device 300. The host interface (I/F) circuit 201 transfers a command and data received from the host device 300 to each of the CPU 203 and the buffer memory 204. Further, the host interface (I/F) circuit 201 transfers data in the buffer memory 204 to the host device 300 in response to a command from the CPU 203.

The NAND interface circuit 205 is connected to the NAND flash memory 100 via a NAND bus. The NAND interface circuit 205 controls a communication between the NAND flash memory 100 and the memory controller 200. The NAND interface circuit 205 transfers a command received from the CPU 203 to the NAND flash memory 100. Further, the NAND interface circuit 205 transfers write data in the buffer memory 204 to the NAND flash memory 100 at the time of data write. Further, the NAND interface circuit 205 transfers data read from the NAND flash memory 100 to the buffer memory 204 at the time of data read.

The NAND bus performs transmission/reception of a signal controlled by the NAND interface. Specific examples of the signal are a command latch enable signal CLE, an address latch enable signal ALE, a write enable signal WEn, a read enable signal REn, a ready/busy signal RBn, and an input/output signal DQ.

The signals CLE and ALE are signals for notifying the NAND flash memory 100 that input signals DQ to the NAND flash memory 100 are a command and an address, respectively. The signal WEn is asserted at a low (L) level and is a signal for causing an input signal DQ to be fetched in the NAND flash memory 100. The term "assert" indicates that a signal or a logic is in a valid (active) state, and the term "negate," having an opposite meaning to the term "assert," indicates that a signal or a logic is in an invalid (inactive) state. The signal REn is also asserted at the L level and is a signal for reading an output signal DQ from the NAND flash memory 100. The ready/busy signal RBn indicates whether the NAND flash memory 100 is in a ready state (which is a state in which the NAND flash memory 100 is able to receive a command from the memory controller 200) or in a busy state (a state in which the NAND flash memory 100 is unable to receive a command from the memory controller 200), and the L level indicates the busy state. The input or output signal DQ is, for example, an 8-bit signal. The input or output signal DQ is the substance of data exchanged between the NAND flash memory 100 and the memory controller 200, and is a command, an address, write data, read data or the like.

The CPU 203 controls the entire operation of the memory controller 200. For example, when receiving a write command from the host device 300, the CPU 203 issues a write command based on the NAND interface circuit 205. This process is also performed similarly in the cases of read and erase. Further, the CPU 203 executes various processes such as wear leveling to manage the NAND flash memory 100. Further, the CPU 203 executes various arithmetic operations. For example, the CPU 203 executes a data encoding process, a randomizing process and others. As described above, when the memory system 1 includes the host device 300, the CPU 203 also controls the entire operation of the memory system 1.

The ECC circuit 206 executes a data error correcting (error checking and correcting (ECC)) process. That is, the ECC circuit 206 generates a parity based on write data at the time of data write. In addition, the ECC circuit 206 generates a syndrome from the parity at the time of data read to detect and correct an error. Alternatively, the CPU 203 may perform the function of the ECC circuit 206.

The internal memory 202 is, for example, a semiconductor memory such as a DRAM, and is used as a work area of the CPU 203. The internal memory 202 holds, for example, a firmware for managing the NAND flash memory 100 or various management tables.

<1-2> Configuration of NAND Flash Memory

Next, a configuration of the NAND flash memory 100 will be described using FIG. 2.

Figure 2:
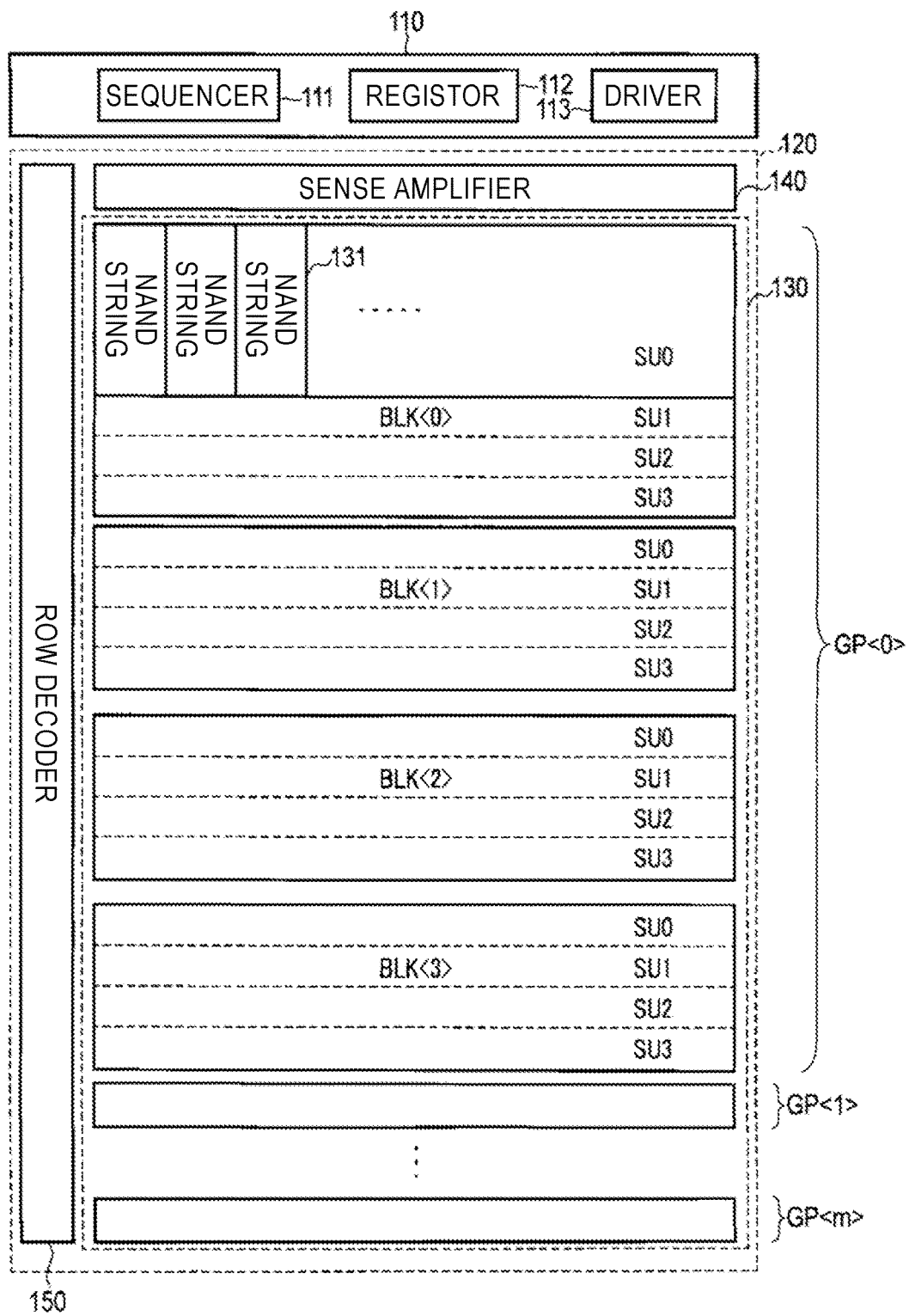
FIG. 2 is a block diagram of a NAND flash memory.

As illustrated in FIG. 2, the NAND flash memory 100 substantially includes a peripheral circuit 110 and a core portion 120.

The core portion 120 includes a memory cell array 130, a sense amplifier 140, and a row decoder 150.

The memory cell array 130 includes a plurality of nonvolatile memory cell transistors, and each of the plurality of nonvolatile memory cell transistors is associated with a word line and a bit line. Further, the memory cell array 130 includes a plurality of blocks BLK (BLK<0>, BLK<1>, BLK<2>, BLK<3> . . . ) each of which is a group of the plurality of nonvolatile memory cell transistors. In addition, the plurality of blocks BLK are grouped. In this embodiment, for example, four blocks BLK are grouped into one group GP. In addition, a plurality of groups GP (m+1 (m: integer) groups GP in this embodiment) are provided.

Data erasing may be performed in the unit of the blocks BLK or in a unit smaller than the blocks BLK. The erasing method is described in, for example, U.S. patent application Ser. No. 13/235,389 filed on Sep. 18, 2011 and entitled "NONVOLATILE SEMICONDUCTOR MEMORY DEVICE," U.S. patent application Ser. No. 12/694,690 filed on Jan. 27, 2010 and entitled "NONVOLATILE SEMICONDUCTOR STORAGE DEVICE," and U.S. patent application Ser. No. 13/483,610 filed on May 30, 2012 and entitled "NONVOLATILE SEMICONDUCTOR MEMORY DEVICE AND DATA ERASE METHOD THEREOF." The entire disclosures of these patent applications are incorporated herein by reference.

Each of the blocks BLK includes a plurality of string units SU (SU0, SU1, SU2, . . . ) each of which is a group of NAND strings 131 in which the memory cell transistors are connected to each other in series. Of course, the number of the blocks within the memory cell array 130 or the number of the string units within one block BLK may be arbitrarily determined. A physical position of a block in the memory cell array 130 is called a block address.

The row decoder 150 brings a block corresponding to a block address into a selected state and word lines of the selected block into a desired voltage state.

The sense amplifier 140 includes a plurality of sense modules (not illustrated). The plurality of sense modules sense data read from the memory cell transistors to the bit lines at the time of data read.

The peripheral circuit 110 includes a sequencer 111, a register 112, a driver 113 and others.

The sequencer 111 controls the entire operation of the NAND flash memory 100.

The register 112 stores various signals. For example, the register 112 stores the status of the data write or erase operation, and notifies the controller of whether the operation is normally completed. The register 112 may also store various tables.

The driver 113 supplies a voltage necessary for the data write, read, and erase to the row decoder 150, the sense amplifier 140, and a source line driver (not illustrated).

<1-3> Memory Cell Array

Figure 3:
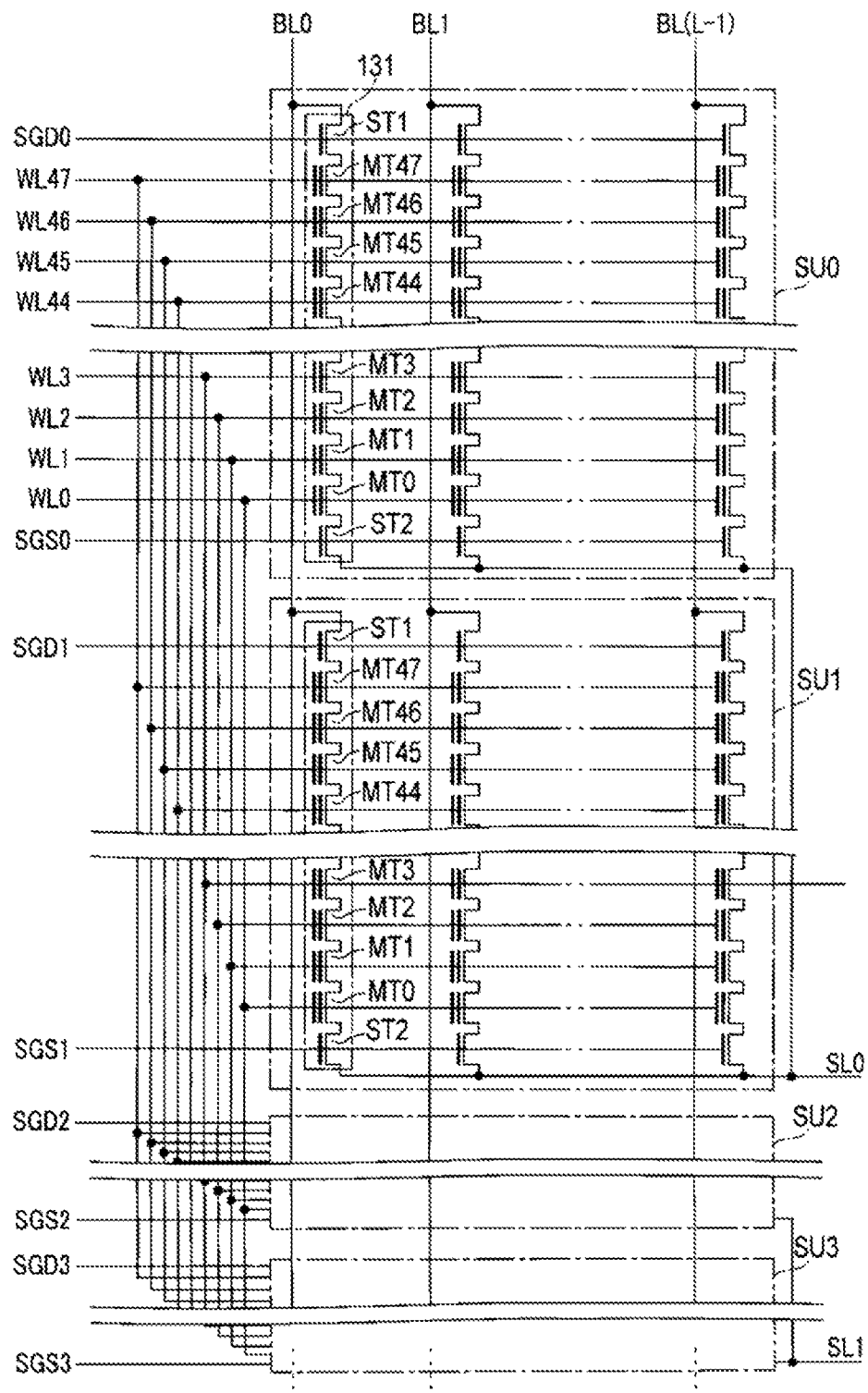
FIG. 3 is a view illustrating a configuration of a memory cell array.

A configuration of the memory cell array will be described using FIG. 3. FIG. 3 illustrates a specific block BLK. As illustrated in FIG. 3, the block BLK includes the plurality of string units SU (SU0 to SU3). Each string unit SU includes the plurality of NAND strings 131.

Each NAND string 131 includes a plurality of memory cell transistors MT (48 memory cell transistors MT0 to MT47 in the example of FIG. 3) and select transistors ST1 and ST2. Each memory cell transistor MT includes a control gate and a charge storage layer and stores data in the nonvolatile manner. The memory cell transistors MT are connected to each other in series between the source of the select transistor ST1 and the drain of the select transistor ST2.

The gates of the select transistors ST1 in the string units SU0 to SU3 are connected to select gate lines SGD0 to SGD3, respectively. The gates of the select transistors ST2 in the string units SU0 to SU3 are connected to, for example, select gate lines SGS0 to SGS3, respectively. In addition, the control gates of the memory cell transistors MT0 to MT47 in the same block BLK are connected to word lines WL0 to WL47, respectively.

The drains of the select transistors ST1 of the NAND strings 131 in the same column within the memory cell array 130 are connected to a bit line BL (BL0 to BL(L−1), where L is an integer of 2 or more). That is, the bit line BL connects the plurality of NAND strings 131 to each other across the plurality of blocks BLK. Further, the sources of the plurality of select transistors ST2 are connected to source lines SL.

The memory cell array 130 may have other configurations, such as the ones described in U.S. patent application Ser. No. 12/407,403 filed on Mar. 19, 2009 and entitled "Three-Dimensional Stacked Nonvolatile Semiconductor Memory," U.S. patent application Ser. No. 12/406,524 filed on Mar. 18, 2009 and entitled "Three-Dimensional Stacked Nonvolatile Semiconductor Memory," U.S. patent application Ser. No. 12/679,991 filed on Mar. 25, 2010 and entitled "Nonvolatile Semiconductor Memory Device and Manufacturing Method Thereof," and U.S. patent application Ser. No. 12/532,030 filed on Mar. 23, 2009 and entitled "Semiconductor Memory and Method of Manufacturing Same." The entire disclosures of these patent applications are incorporated herein by reference.

<1-4> Row Decoder and Control Related to Row Decode

A configuration of the row decoder 150 and an operation of the row decoder 150 at the time of a block selecting operation will be described using FIGS. 4 to 8. The block selecting operation is performed at the time of an access operation (data reading, writing, or erasing) to a selected block BLK.

Figure 4:
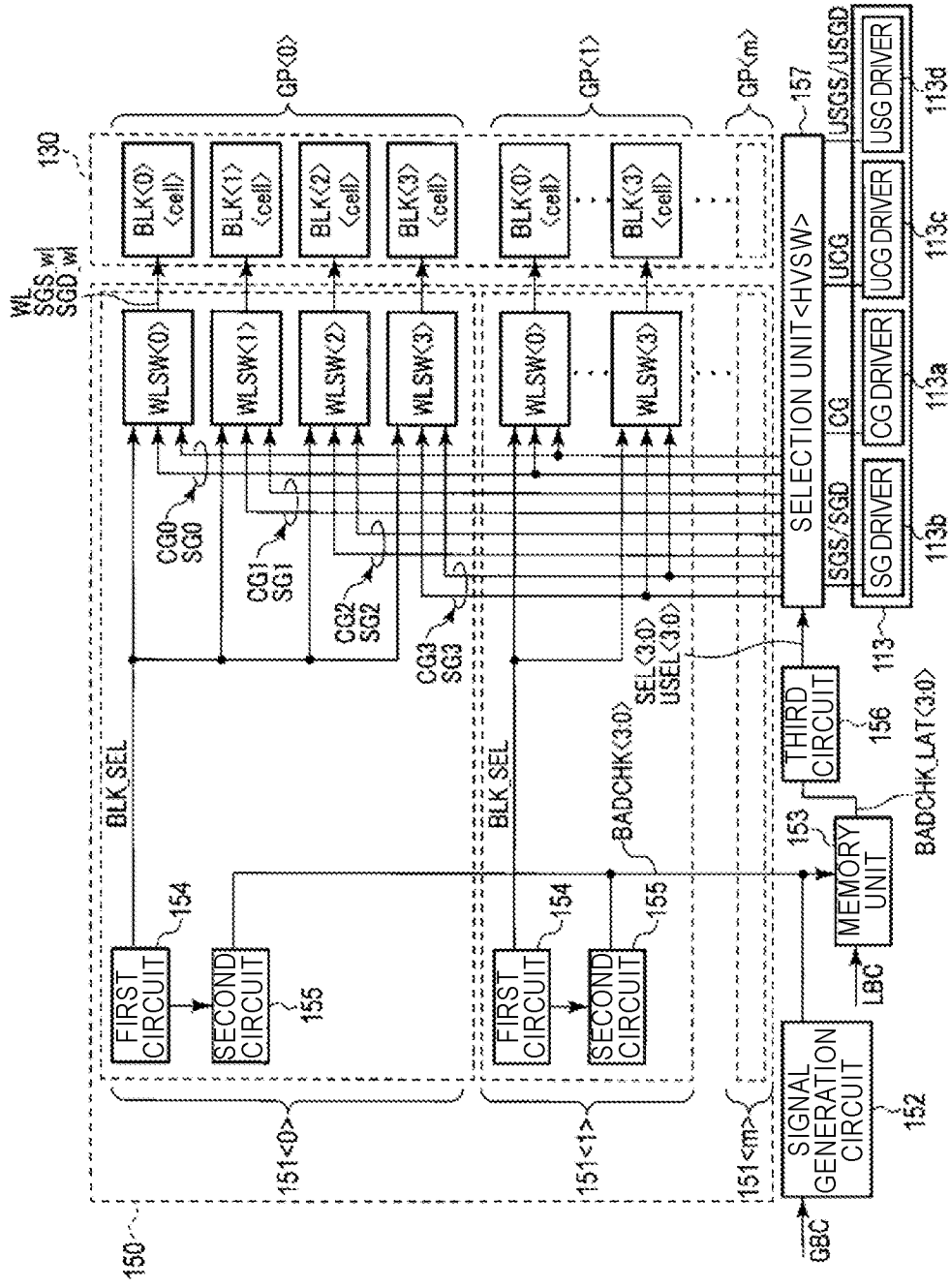
FIG. 4 is a view illustrating a configuration of a row decoder.

The row decoder 150 performs a selection control in the unit of the plurality of blocks (e.g., the groups GP). As illustrated in FIG. 4, the row decoder 150 includes a plurality of decode circuits 151.

<1-4-1> Decode Circuits

A decode circuit 151 is provided for each of the groups GP (for the four blocks in this embodiment). Specifically, in this embodiment, m+1 decode circuits 151 are provided to correspond to m+1 groups GP. The decode circuits 151 select one group GP (which includes four blocks) based on a received signal (e.g., EN and ADDRESS) and block state information (which is GOOD or BAD). That is, when state information of a selected block in a group GP selected by the received signal is GOOD, a corresponding signal BLK_SEL becomes "H," and four WLSW circuits (including unselected blocks in the group GP) are selected. When the state information of the selected block in the group GP selected by the received signal is BAD, the corresponding signal BLK_SEL becomes "L," and the four WLSW circuits are brought into an unselected state.

In FIG. 4, CG0 indicates a CG line (which is an intermediate signal line electrically connected to a WL line) corresponding to the block BLK<0> in the group GP, and a plurality of CG lines exist. In FIG. 4, SG0 is an SG line (which is an intermediate signal line electrically connected to SGS_wl or SGD_wl) corresponding to the block BLK<0> in the group GP, and a plurality of SG lines may exist. Decoding of the CG lines and the SG lines corresponding to the blocks BLK in the group GP as described above is performed by a selection unit HVSW. That is, the selection unit HVSW decodes the signals CG/SGS/SGD for the selected block BLK in the group GP and the signals UCG/USGS/USGD for the unselected blocks BLK in the group GP that are generated by the driver 113, and supplies a voltage to each of the corresponding WLSW circuits. The indications "<m:0>" and "<0> to <m>" have the same meaning.

Hereinafter, descriptions will be made focusing on one decode circuit 151<0>.

The decode circuit 151 includes a first circuit 154 and a second circuit 155.

<1-4-2> First Circuit 154

<1-4-2-1> Configuration of First Circuit 154

Figure 5:
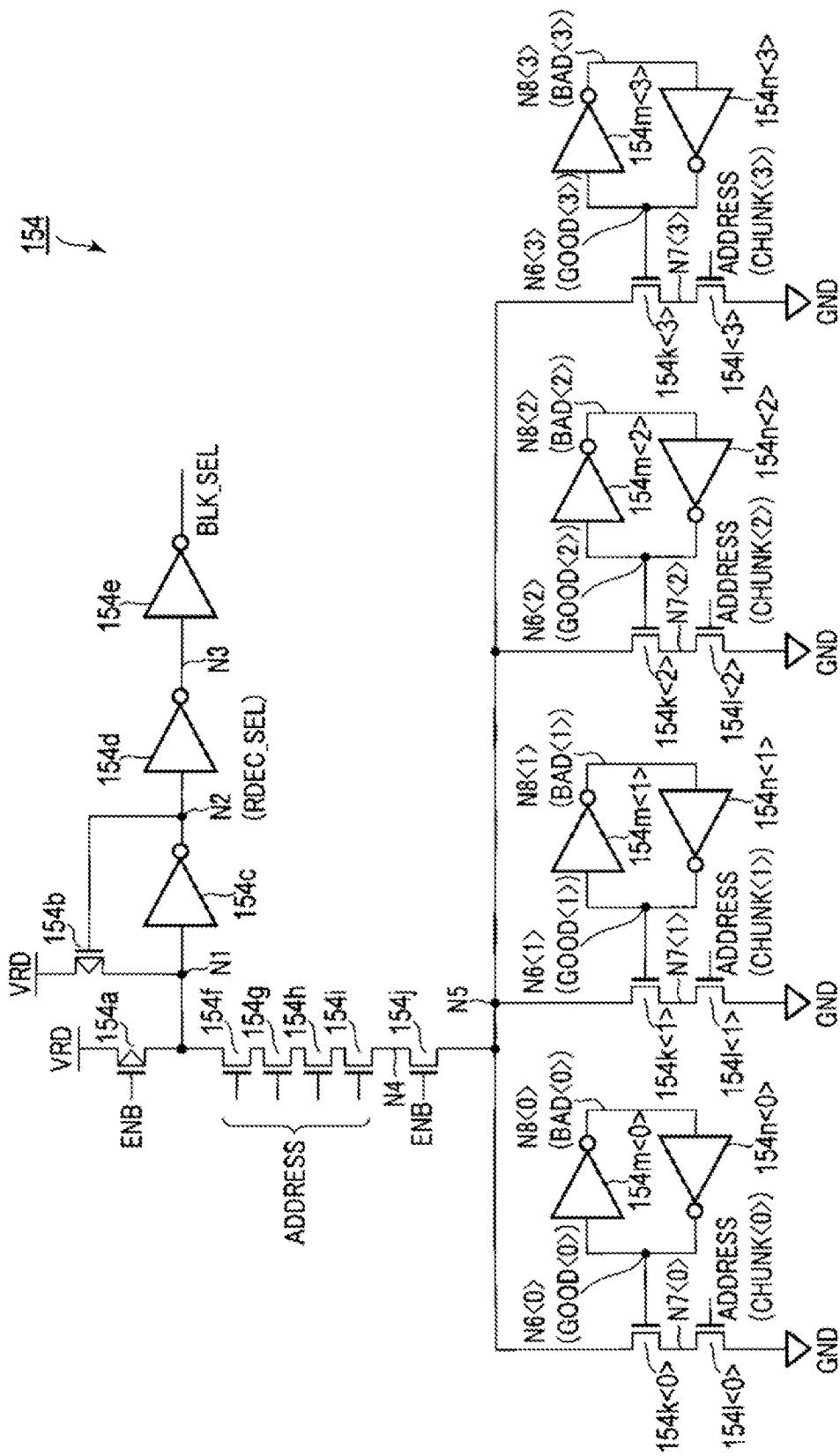
FIG. 5 is a view illustrating a configuration of a first circuit.

A configuration of the first circuit 154 of the decode circuit 151<0> will be described using FIG. 5.

The first circuit 154 generates signals BLK_SEL and RDEC_SEL based on the signal EN and ADDRESS. The signal EN and ADDRESS are supplied from the sequencer 111. As illustrated in FIG. 5, for example, the first circuit 154 includes PMOS transistors 154a and 154b, NMOS transistors 154f, 154g, 154h, 154i, 154j, 154k<0> to 154k<3>, and 154l<0> to 154l<3>, and inverters 154c, 154d, 154e, 154m<0> to 154m<3>, and 154n<0> to 154n<3>.

In the PMOS transistor 154a, a power supply voltage VRD is applied to the source, an inverted signal ENB of the signal EN is supplied to the gate, and the drain is connected to a node N1.

The inverter 154c generates the signal RDEC_SEL. The inverter 154c inverts a signal received from the node N1 and outputs the signal to a node N2. The signal RDEC_SEL is used for controlling the second circuit 155 as described later.

In the PMOS transistor 154b, the power supply voltage VRD is applied to the source, the signal RDEC_SEL is supplied to the gate, and the drain is connected to the node N1.

The inverter 154d inverts a signal received from the node N2 and outputs the signal to a node N3.

The inverter 154e generates the signal BLK_SEL by inverting the signal received from the node N3. The signal BLK_SEL is input to the selection unit 157.

The NMOS transistors 154f, 154g, 154h, and 154i are provided to decode an address related to a group GP (group address) and arranged in series. Although four transistors are provided as components for decoding the group address, the number of the transistors is not necessarily limited thereto.

In the NMOS transistor 154j, a decode result of the group address is supplied to the drain, the signal ENB is supplied to the gate, and the source is connected to a node N5.

The inverters 154m<0> to 154m<3> and 154n<0> to 154n<3> are each provided to correspond to one of the blocks BLK (which is four blocks in this embodiment) in the group GP, and store block state information indicating whether the blocks BLK in the corresponding group GP are GOOD or BAD. Although not illustrated in FIG. 5, a BAD node corresponding to a block BLK in the group GP that was determined to be bad in a test (such as a die sorting test) is logically set to the "H" level and a corresponding GOOD node is logically set to the "L" level. While the good block BLK is used for the data write and read, the bad block BLK is not used for the data write and read. In this embodiment, the four sets of inverters 154m and 154n are provided to store the state of the four blocks BLK in the group GP. Specifically, the state of the blocks BLK<Y (Y: integer)> in the group GP is stored in memory circuits constituting latch circuits of the inverters 154m<Y> and 154n<Y>. More specifically, in this embodiment, information indicating that the blocks BLK<0> to BLK<3> in the group GP are good (good information GOOD<0> to GOOD<3>) is stored in nodes N6<0> to N6<3> (referred to as good information memory nodes), respectively. Further, information indicating that the blocks BLK<0> to BLK<3> in the group GP are bad (referred to as bad information BAD<0> to BAD<3>) is stored in nodes N8<0> to N8<3> (referred to as bad information memory nodes), respectively. For example, when the potentials of the good information memory nodes (which are the nodes N6<0> to N6<3>) are at the "high (H)" level, the blocks BLK in the corresponding group GP are determined to be GOOD. When the potentials of the bad information memory nodes (which are the nodes N8<0> to N8<3>) are at the "H" level, the blocks BLK in the corresponding group GP are determined to be BAD. For example, the good information (GOOD<0> to GOOD<3>) or the bad information (BAD<0> to BAD<3>) is stored in the respective memory nodes, for example, at the time of testing the semiconductor memory device prior to the shipment thereof. In addition, in using the semiconductor memory device, the good blocks BLK in the group GP may become bad blocks BLK. In this case, the good information (GOOD<0> to GOOD<3>) or the bad information (BAD<0> to BAD<3>) may be updated by the memory system 1 or the host device 300.

In this embodiment, the four NMOS transistors 154k are provided to correspond to the four sets of inverters 154m and 154n. In the NMOS transistors 154k<0> to 154k<3>, a decode result of the group address is supplied to the drains, the good information (GOOD<0> to GOOD<3>) is supplied to the gates, and nodes N7<0> to N7<3> are connected to the sources, respectively.

The NMOS transistors 154l<0> to 154l<3> are provided for the sets of inverters 154m and 154n, respectively. In the NMOS transistors 154l<0> to 154l<3>, a decode result of the group address is supplied to the drains, block BLK addresses (depicted as CHUNK<3:0>) in the group GP are supplied to the gates, respectively, and the sources are connected to the ground.

<1-4-2-2> Operation of First Circuit 154

Subsequently, an operation of the first circuit 154 at the time of the block selecting operation will be described.

Prior to the start of the block selecting operation, the sequencer 111 sets the signal ENB to the "L" level. Accordingly, the node N1 is charged via the PMOS transistors 154a and 154b. At this time, the signal BLK_SEL is at the "L" level. Then, when the block selecting operation starts, the sequencer 111 switches the signal ENB to the "H" level. Accordingly, the charging of the node N1 is completed.

<1-4-2-2-1> When the Group Corresponding to the Decode Circuit is Selected

Descriptions will be made on a case where the group corresponding to the decode circuit 151 is selected. When the block selecting operation starts, an address is input from the sequencer 111, and the group corresponding to the decode circuit 151 is selected, so that the NMOS transistors 154f, 154g, 154h, and 154i go into an ON state. Thereafter, the signal ENB is switched from the "L" level to the "H" level. Accordingly, the node N1 is electrically connected to the node N5. Then, the block BLK addresses in the group GP are input from the sequencer 111, and the corresponding NMOS transistors 154l go into an ON state. When the good blocks BLK in the group GP are selected, the NMOS transistors 154k go into an ON state. Thus, the node N1 is electrically connected to the ground. As a result, the node N1 becomes the "L" level, and the signals RDEC_SEL and BLK_SEL become the "H" level.

When the bad blocks BLK in the group GP are selected, the NMOS transistors 154k go into an OFF state. Accordingly, the potential of the node N1 is kept at the "H" level, and the signals RDEC_SEL and BLK_SEL are kept at the "L" level.

<1-4-2-2-2> When the Group Corresponding to the Decode Circuit is Not Selected

Descriptions will be made on a case where the group corresponding to the decode circuit 151 is not selected. When the block selecting operation starts, an address is input from the sequencer 111, and the signal ENB is switched from the "L" level to the "H" level. However, since the group corresponding to the decode circuit 151 is not selected, one of the NMOS transistors 154f, 154g, 154h, and 154i go into an OFF state. As a result, the potential of the node N1 is kept at the "H" level, and the signals RDEC_SEL and BLK_SEL are kept at the "L" level.

<1-4-3> Signal Generation Circuit 152 and Second Circuit 155

Next, the signal generation circuit 152 and the second circuit 155 of the decode circuit 151<0> will be described.

<1-4-3-1> Configurations of Signal Generation Circuit 152 and Second Circuit 155

As illustrated in FIG. 4, the signal generation circuit 152 (disposed outside the row decoder in this embodiment) includes a PMOS transistor for each signal BADCHK. The PMOS transistors 152a generate the signals BADCHK. Specifically, in the present embodiment, four PMOS transistors 152a<0> to 152a<3> are provided to correspond to four signals BADCHK<0> to BADCHK<3> (in the present embodiment, the PMOS transistors are used for an "H" level pre-charge method of the signals BADCHK). The number of the transistors corresponds to the number of the block BLKs in the group GP, and since the number of the blocks BLK in the group GP is four in the present embodiment, four sets of the signals BADCHK and the PMOS transistors 152a<0> to 152a<3> are provided. In the PMOS transistors 152a, the power supply voltage VRD (the power supply used for the row decoder) is applied to the sources, a signal GBC is supplied to the gates, and the drains are connected to signal lines for supplying the signals BADCHK. The signal GBC is supplied from the sequencer 111. The signal lines for supplying the signals BADCHK are also connected to the second circuit 155 of another decode circuit 151. In the present embodiment, the power supply VRD is used for the source of the signal generation circuit 152. However, any other power supply may be used as long as the contents suggested herein may be implemented. In addition, the power supply may not be necessarily the same power supply used for the row decoder.

Figure 6:
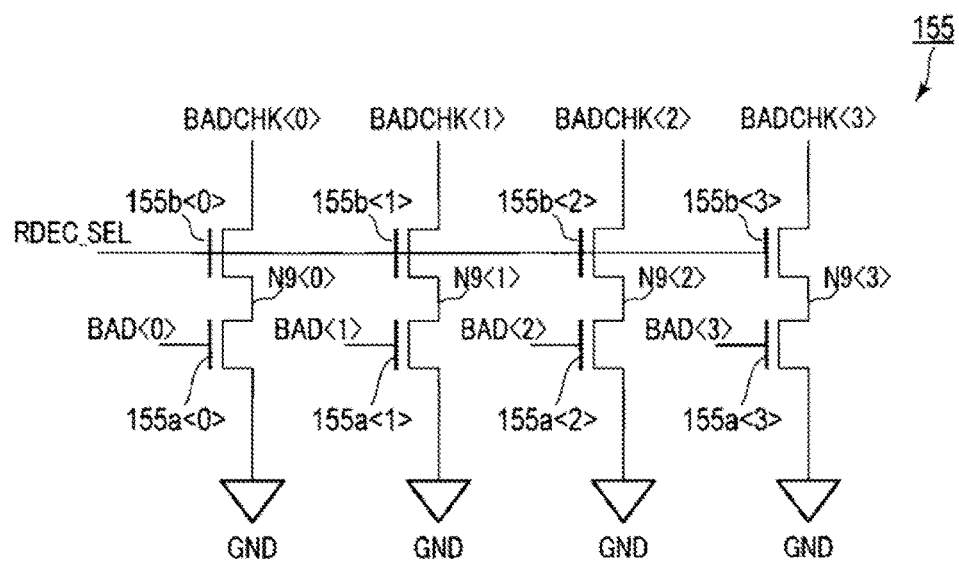
FIG. 6 is a view illustrating a configuration of a second circuit.

As illustrated in FIG. 6, the second circuit 155 includes NMOS transistors 155a<Y> and 155b<Y> that correspond to a block BLK<Y> in the group GP. Specifically, as illustrated in FIG. 6, for example, the second circuit 155 includes NMOS transistors 155a<0> to 155a<3> and 155b<0> to 155b<3> that correspond to the blocks BLK<0> to BLK<3> in the group GP, respectively.

The NMOS transistors 155a<0> to 155a<3> discharge nodes N9<0> to N9<3>, respectively, based on the bad information BAD<0> to BAD<3>. The NMOS transistors 155b<0> to 155b<3> connect the nodes N9<0> to N9<3> to the signal lines of the signals BADCHK<0> to BADCHK<3> output by the signal generation circuit 152, based on the signal RDEC_SEL.

<1-4-3-2> Operations of Signal Generation Circuit 152 and Second Circuit 155

Subsequently, descriptions will be made on operations of the signal generation circuit 152 and the second circuit 155 at the time of the block selecting operation.

As illustrated in FIG. 4, first, the signal generation circuit 152 charges the signals BADCHK<0> to BADCHK<3> to bring the signals BADCHK<0> to BADCHK<3> into the "H" level, prior to the start of the block selecting operation, and the "H" level is kept in a floating state until the processes of <1-4-3-2-1>, <1-4-3-2-2>, and <1-4-4> are ended. That is, during the processes, the PMOS transistors 152a of the signal generation circuit 152 go into an OFF state.

<1-4-3-2-1> When the Group Corresponding to the Decode Circuit is Selected

Descriptions will be made on a case where the group corresponding to the decode circuit 151 is selected. When the block selecting operation starts, the signal RDEC_SEL becomes the "H" level as described above. Thus, the NMOS transistors 155b<0> to 155b<3> go into an ON state.

Then, when a block BLK<Y> in the group GP is bad, BAD<Y> becomes the "H" level. Thus, the NMOS transistor 155a<Y> go into an ON state. As a result, the signal BADCHK<Y> is switched from the "H" level to the "L" level.

Meanwhile, when the block BLK<Y> in the group GP is good, BAD<Y> becomes the "L" level. Thus, the NMOS transistor 155a<Y> go into an OFF state. As a result, the signal BADCHK<Y> is kept at the "H" level.

<1-4-3-2-2> When the Group Corresponding to the Decode Circuit is Not Selected

Next, descriptions will be made on a case where the group corresponding to the decode circuit 151 is not selected. When the block selecting operation starts, the signal RDEC_SEL becomes the "L" level as described above. Thus, the NMOS transistors 155b<0> to 155b<3> go into an OFF state. As a result, the signals BADCHK<0> to BADCHK<3> are kept at the "H" level.

<1-4-4> Memory Unit 153

As illustrated in FIG. 4, the memory unit 153 stores the signals BADCHK<0> to BADCHK<3> based on the signal LBC. Then, the memory unit 153 supplies the signals BADCHK<0> to BADCHK<3> as signals BADCHK_LAT<0> to BADCHK_LAT<3> to the third circuit 156. In this embodiment, it is assumed that when the signal BADCHK<Y> is at the "L" level, the signal BADCHK_LAT<Y> is also at the "L" level. Meanwhile, it is assumed that when the signal BADCHK<Y> is at the "H" level, the signal BADCHK_LAT<Y> is also at the "H" level. The signal LBC is supplied from the sequencer 111.

<1-4-5> Third Circuit 156

As illustrated in FIG. 4, the third circuit 156 is a logic circuit that generates signals SEL<3:0> and USEL<3:0> to satisfy the following requirements, based on the signal EN, ADDRESS, and the signals BADCHK_LAT<0> to BADCHK_LAT<3>. The operation of the third circuit 156 when a specific group GP is selected will be described below.

Specifically, when a block BLK<Y> in the specific group GP (one of the four blocks in the group GP, in this embodiment) is selected, and the signal BADCHK_LAT<Y> corresponding to the block is at the "H" level (i.e., when the block BLK<Y> in the specific group GP is good), the third circuit 156 sets the signal SEL<Y> to the "H" level and the signal USEL<Y> to the "L" level.

When a block BLK<Y> in the specific group GP (one of the four blocks in the group GP, in this embodiment) is selected, and the signal BADCHK_LAT<Y> corresponding to the block is at the "L" level (i.e., when the block BLK<Y> in the specific group GP is bad), the third circuit 156 sets the signals SEL<Y> and USEL<Y> to the "L" level.

In addition, as to the unselected blocks BLK in the specific group GP (which are three of the four blocks in the group GP that are not selected), the signal SEL corresponding to the blocks becomes the "L" level, and the signal USEL corresponding to the blocks becomes the "H" level.

<1-4-6> Selection Unit 157

Figure 7:
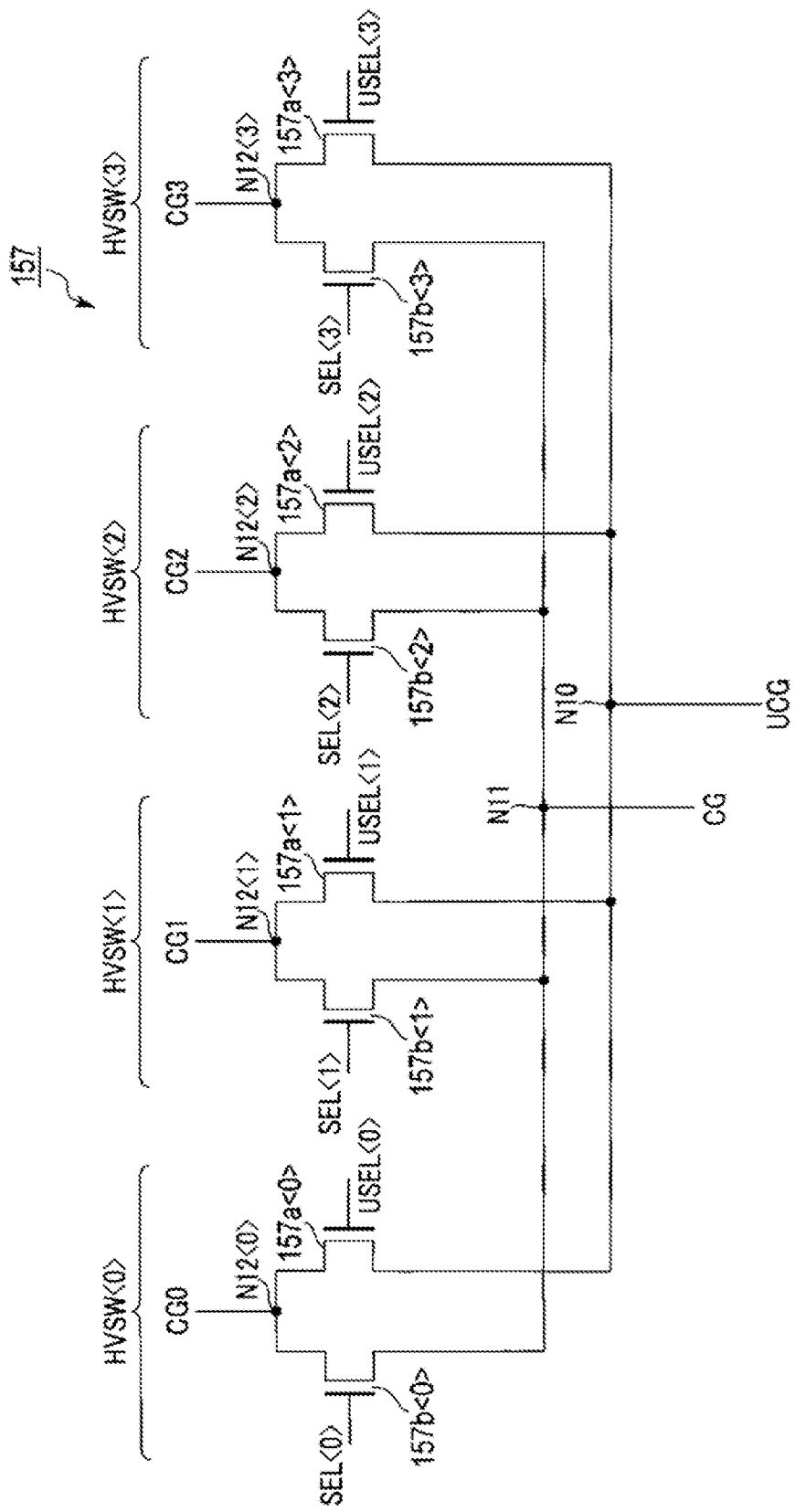
FIG. 7 is a view illustrating a configuration of a selection unit.

Next, the selection unit 157 of FIG. 4 will be described using FIG. 7. Here, for the sake of simplification, descriptions will be made focusing on the selection unit HVSW related to the word lines WL (which are the word lines WL0 to WL47 in this embodiment). In addition, since the selection unit related to SGD/SGS employs the same control as the related art, descriptions thereof will be omitted.

<1-4-6-1> Configuration of Selection Unit 157

The selection unit 157 includes a selection unit HVSW<Y> corresponding to a block BLK<Y> in the group GP. Specifically, as illustrated in FIG. 7, for example, the selection unit 157 includes selection units HVSW<0> to HVSW<3> corresponding to the blocks BLK<0> to BLK<3> in the group GP. Each of the selection units HVSW<0> to HVSW<3> includes the NMOS transistors 157a and 157b.

One ends of NMOS transistors 157a<0> to 157a<3> are connected to CG0, CG1, CG2, and CG3, respectively, signals USEL<0> to USEL<3> are supplied to the gates of the transistors, respectively, and the other ends of the transistors are connected to a node N10. A voltage UCG is a voltage transferred to the word lines WL of the unselected blocks in the selected group GP (where three of the four blocks in the present embodiment; one of the four blocks is a selected block).

One ends of NMOS transistors 157b<0> to 157b<3> are connected to CG0, CG1, CG2, and CG3, respectively, signals SEL<0> to SEL<3> are supplied to the gates of the transistors, respectively, and the drains of the transistors are connected to a node N11. A voltage CG is a voltage transferred to the word lines WL of the selected block in the selected group GP.

<1-4-6-2> Operations of Selection Unit 157 and WLSW Circuits

Figure 8:
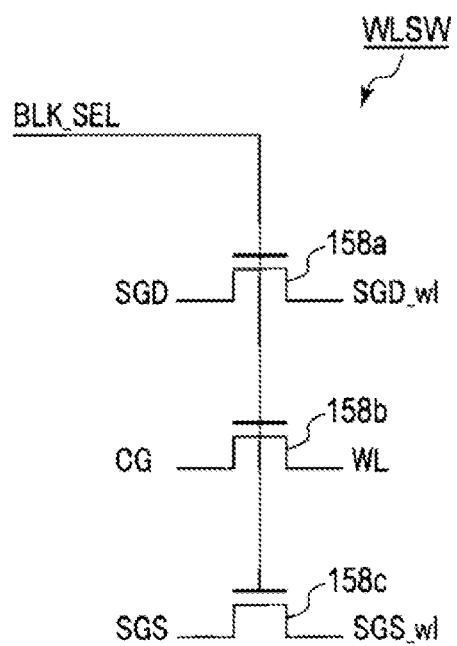
FIG. 8 is a view illustrating a configuration of a WLSW (word line switch).

Next, operations of the WLSW circuits in the selected group GP and the selection unit 157 will be described using FIGS. 7 and 8.

<1-4-6-2-1> When the Group Corresponding to the Decode Circuit is Selected

Descriptions will be made on the case where the group corresponding to the decode circuit 151 is selected. When the block selecting operation starts, the signal BLK_SEL becomes the "H" level as described above. Thus, the four WLSW circuits in the selected group GP go into an ON state (i.e., brought into a connection state). That is, the NMOS transistors 158a, 158b, and 158c provided in each of the four WLSW circuits in the selected group GP go into an ON state (see FIG. 8).

When a selected block BLK<Y> in the selected group GP is good, the signal USEL<Y> becomes the "L" level, and the signal SEL<Y> becomes the "H" level. Thus, the NMOS transistor 157a<Y> goes into an OFF state, and the NMOS transistor 157b<Y> goes into an ON state. As a result, the voltage CG is transferred to the word lines WL(BLK<Y>) related to the block BLK<Y>.

When the unselected blocks BLK<Y> in the selected group GP are good, the signal USEL<Y> becomes the "H" level, and the signal SEL<Y> becomes the "L" level.

Accordingly, the NMOS transistor 157a<Y> goes into an ON state, and the NMOS transistor 157b<Y> goes into an OFF state. As a result, the voltage UCG is transferred to the word lines WL (BLK<Y>) related to the blocks BLK<Y>.

When the unselected blocks BLK<Y> in the selected group GP are bad, both the signals SEL<Y> and USEL<Y> become the "L" level. Thus, both the NMOS transistors 157a<Y> and 157b<Y> go into an OFF state. As a result, the word lines WL(BLK<Y>) related to the blocks BLK<Y> are brought into the floating state.

When the selected block BLK<Y> in the selected group GP is bad, the signal BLK_SEL becomes the "L" level, and thus, the word lines WL of the block BLK in the selected group GP are brought into the electrically floating state (is not selected).

<1-4-6-2-2> When the Group Corresponding to the Decode Circuit is Not Selected

Descriptions will be made on the case where the group corresponding to the decode circuit 151 is not selected. When the block selecting operation starts, the signal BLK_SEL becomes the "L" level as described above. Thus, since the WLSW circuits in the unselected group GP go into an OFF state, the word lines WL of the unselected group are brought into the electrically floating state. The configuration of the decode circuit 151<0> has been described, and the decode circuits 151<1> to 151<m> have the same configuration as that of the decode circuit 151<0>.

<1-5> Waveforms of Signals at the Time of the Block Selecting Operation

Figure 9:
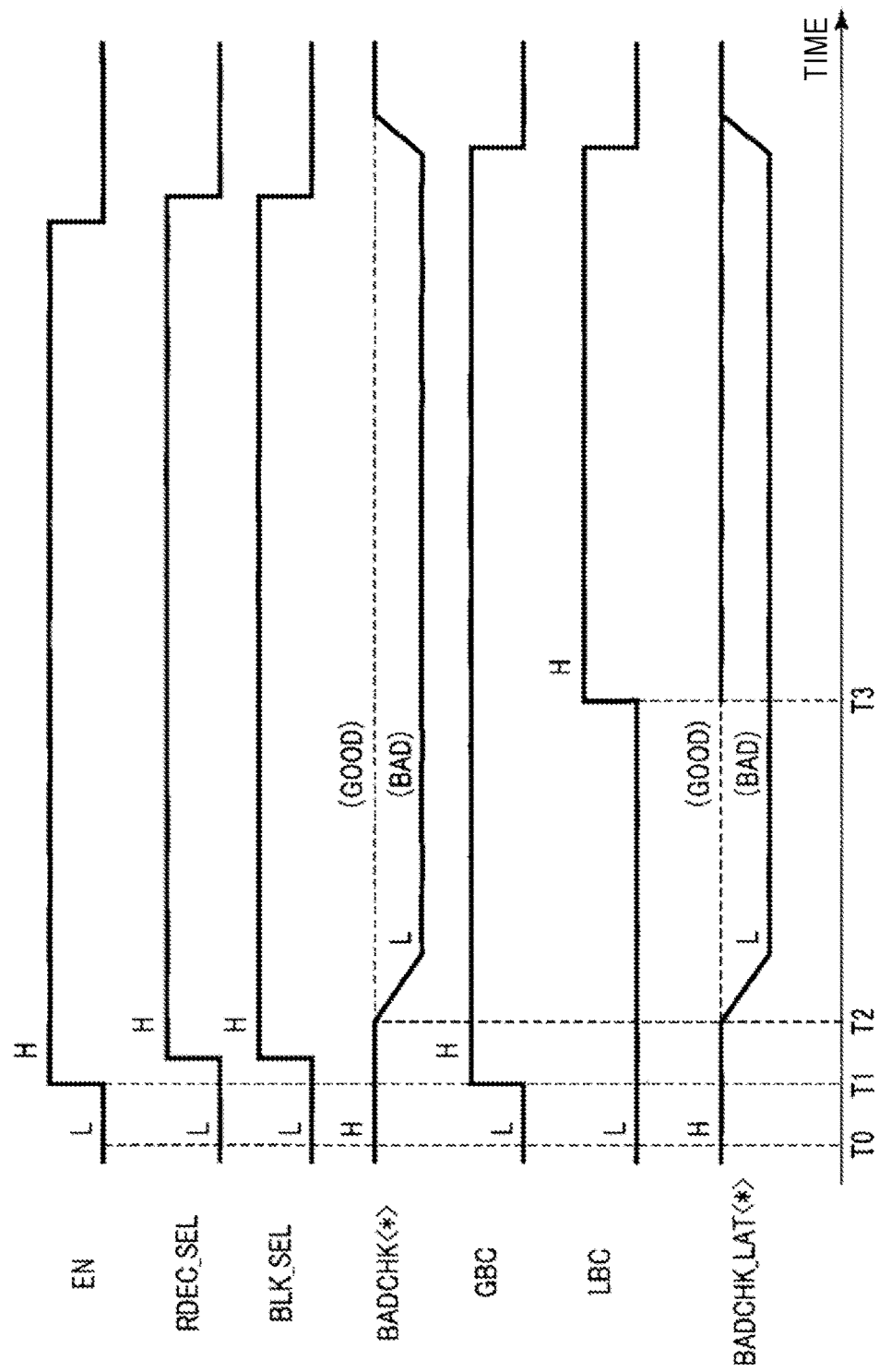
FIG. 9 is a view illustrating a waveform of each signal at the time of a block selecting operation.

A waveform of each signal at the time of the block selecting operation will be described using FIG. 9. Here, descriptions will be made focusing on the signals related to the decode circuit 151 in the selected group and the relevant control circuits.

[Timing T0]

Prior to the start of the block selecting operation, the sequencer 111 sets the signals EN, GBC, and LBC to the "L" level. As described above, the signals RDEC_SEL and BLK_SEL become the "L" level at timing T0.

[Timing T1]

When the block selecting operation starts, the sequencer 111 switches the signals EN and GBC to the "H" level and supplies an address to the decode circuit 151. Between timings T1 and T2, the first circuit 154 switches the signals RDEC_SEL and BLK_SEL for the selected group GP to the "H" level.

[Timing T2]

The signal generation circuit 152 and the second circuit 155 set the signal BADCHK corresponding to a bad block to the "L" level, and hold the signal BADCHK related to a good block at the "H" level ("H" in the floating state). Similarly, the signal BADCHK_LAT corresponding to the bad block becomes the "L" level, and the signal BADCHK_LAT related to the good block becomes the "H" level.

[Timing T3]

After the signal BADCHK is stabilized, the sequencer 111 switches the signal LBC to the "H" level. Accordingly, the memory unit 153 stores the signal BADCHK_LAT. Then, the selection unit 157 performs an operation of selecting the CG lines of the four blocks in the above-described group GP.

Thereafter, the sequencer 111 switches the signals EN, GBC, and LBC to the "L" level, and the block selecting operation is ended.

<1-6> Effects

In order to describe effects of the above-described embodiment, a comparative example is described below using FIG. 10.

In a row decoder that shares a plurality of blocks and selects the blocks, a selected block and unselected blocks exist. The voltage CG for selection is applied to the word lines WL of the selected block, and the voltage UCG for non-selection is applied to the word lines of the unselected blocks. This technique is important for reducing the area of the semiconductor memory device.

Figure 10:
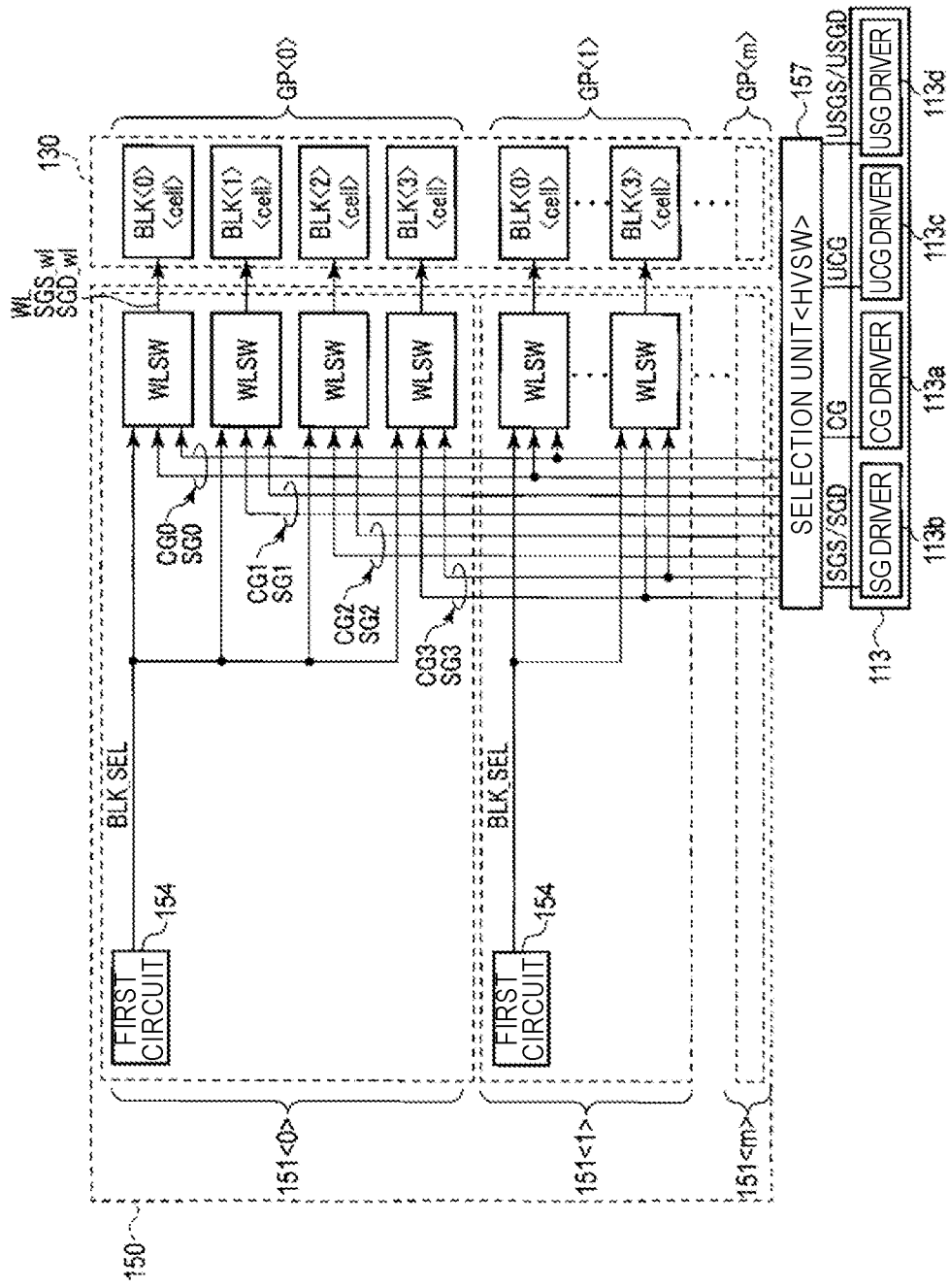
FIG. 10 is a view illustrating a configuration of a row decoder according to a comparative example.

As illustrated in FIG. 10, in the semiconductor memory device according to the comparative example, while bad information of the selected block of the selected group is read, bad information of the unselected blocks is not read. Thus, the common voltage UCG is applied to the word lines WL of the unselected blocks. The unselected blocks in the selected group may include a bad block. Thus, in the comparative example, when the bad block exists, even though a good block within the selected group is selected, the voltage UCG applied to the unselected block is still applied. As a result, a defective leakage current may flow in the unselected blocks, thereby causing drop of the voltage UCG or increase of the operation current. Therefore, a yield may be lowered in the row decoder sharing a plurality of blocks as in the comparative example, and reliability may be lowered in a case where the bad block is generated periodically.

According to the semiconductor memory device of the above-described embodiment, the row decoder that selects a plurality of blocks at the same time may determine a good block and a bad block at the same time. Then, the semiconductor memory device brings the bad block within the selected group GP into the electrically floating state. Accordingly, when the unselected blocks within the selected group GP include a bad block, the bad block is brought into the electrically floating state so that an undesired current may be prevented from flowing in the bad block.

A bad block is determined to be "bad" for various factors. As a factor for determining that a block is bad, "current leakage" is considered. When the voltage UCG is transferred to the bad block, a large current may flow in the bad block depending on the voltage level of the voltage UCG. As a result, the large current may adversely affect the operation of selecting other blocks. Thus, the bad block is required to be brought into the electrically floating state.

According to the above-described embodiment, the bad block is always brought into the electrically floating state. Thus, the foregoing problems do not occur. As a result, according to the above-described embodiment, it is possible to provide the semiconductor memory device in which the operation reliability and yield may be improved without deteriorating the operation performance.

<2> Second Embodiment

A second embodiment will be described. In the second embodiment, another example of the selection unit 157 will be described. In addition, the basic configuration and operation of the memory device according to the second embodiment are the same as those of the memory device according to the first embodiment. Thus, descriptions of the matters that have been described in the first embodiment and may be easily conceived from the first embodiment will be omitted.

<2-1> Row Decoder

A configuration of the row decoder 150 and an operation of the row decoder 150 at the time of the block selecting operation will be described using FIGS. 11 to 12.

<2-1-1> Third Circuit 156

Figure 11:
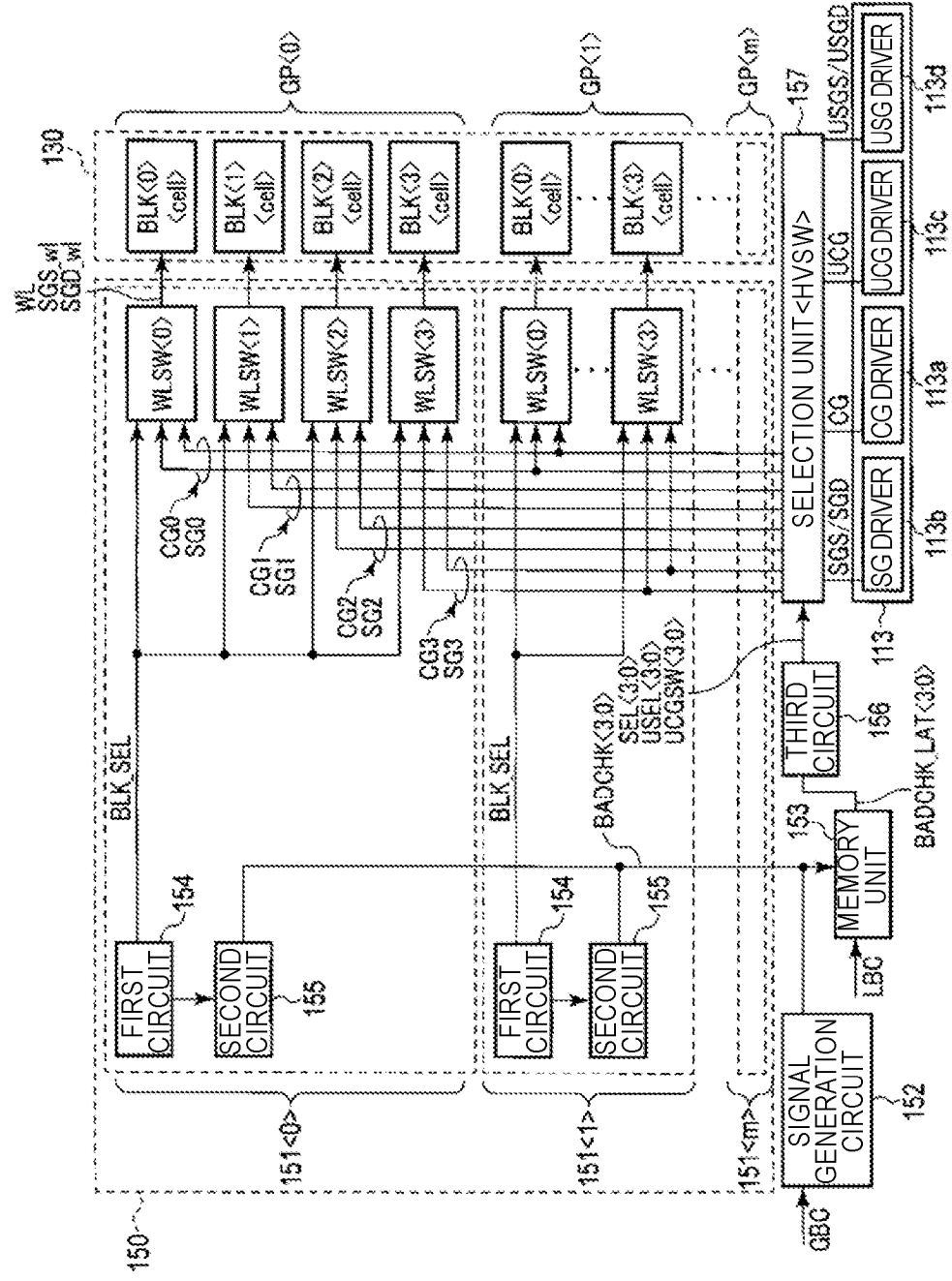
FIG. 11 is a view illustrating another configuration of the row decoder.
Figure 12:
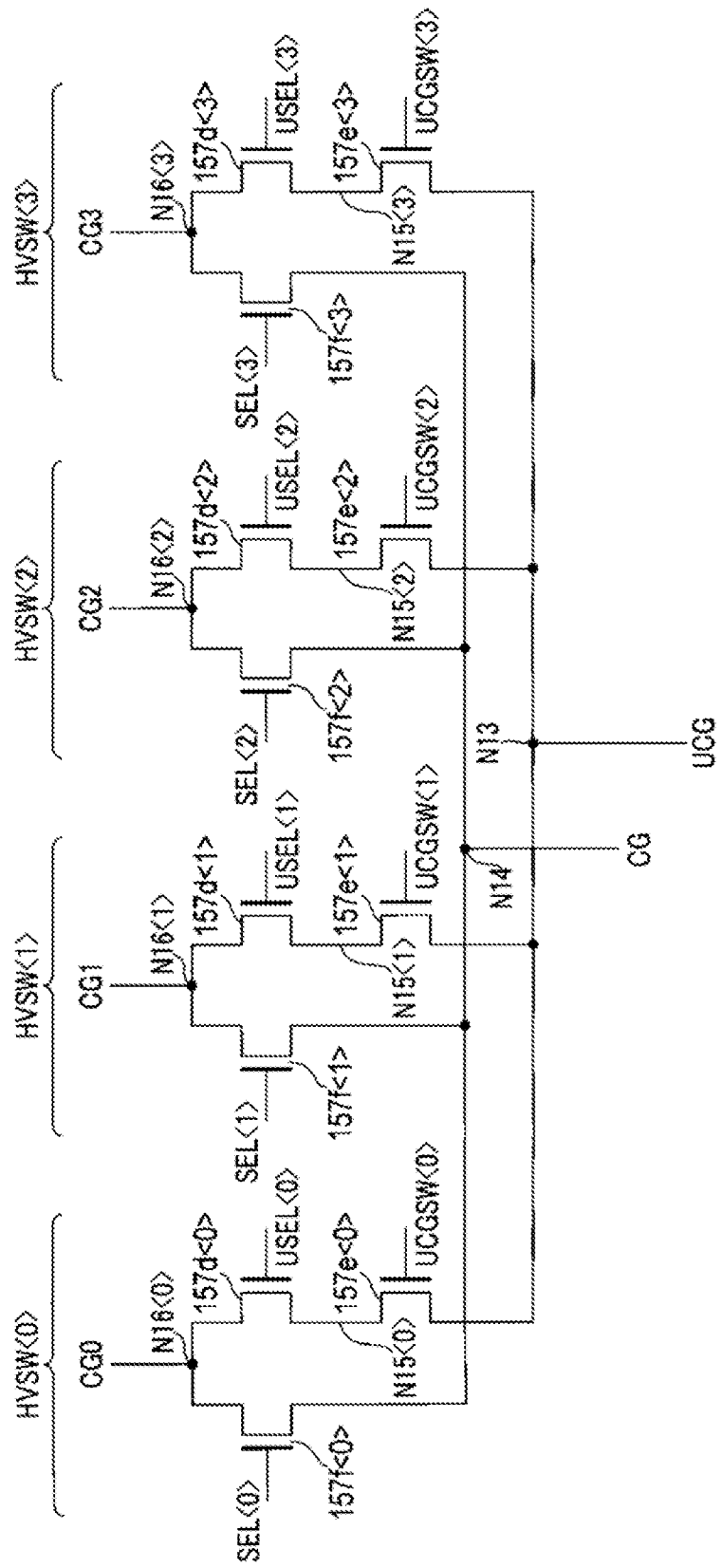
FIG. 12 is a view illustrating another configuration of the selection unit.

As illustrated in FIG. 11, the third circuit 156 generates signals UCGSW<3:0>, SEL<3:0>, and USEL<3:0> based on the signal EN, ADDRESS, and the signals BADCHK_LAT<0> to BADCHK_LAT<3>.

Specifically, when a block BLK<Y> in the specific group GP is selected, and the signal BADCHK_LAT<Y> is at the "H" level (i.e., the block BLK<Y> is good), the third circuit 156 sets the signal SEL<Y> to the "H" level, the signal USEL<Y> to the "L" level, and the signal UCGSW<Y> to the "L" level.

In the unselected blocks<Y> in the specific group GP, when the corresponding signal BADCHK_LAT<Y> is at the "H" level (i.e., the blocks BLK<Y> are good), the third circuit 156 sets the signal SEL<Y> to the "L" level and the signals UCGSW<Y> and USEL<Y> to the "H" level.

In the unselected blocks BLK<Y> in the specific group GP, when the corresponding signal BADCHK_LAT<Y> is at the "L" level (i.e., the blocks BLK<Y> are bad), the third circuit 156 sets the signal USEL<Y> to the "H" level, and the signals SEL<Y> and UCGSW<Y> to the "L" level.

<2-1-2> Selection Unit 157

<2-1-2-1> Configuration of Selection Unit 157

Next, the selection unit 157 will be described using FIG. 12. Here, for the sake of simplification, descriptions will be made focusing on the selection unit HVSW related to the word lines WL.

Each of the selection units HVSW<0> to HVSW<3> includes NMOS transistors 157d, 157e, and 157f.

One ends of the NMOS transistors 157d<0> to 157d<3> are connected to nodes N15<0> to N15<3>, respectively, the signals USEL<0> to USEL<3> are supplied to the gates of the transistors, respectively, and the other ends of the transistors are connected to CG0, CG1, CG2, and CG3, respectively.

One ends of the NMOS transistors 157e<0> to 157e<3> are connected to the nodes N15<0> to N15<3>, respectively, signals UCGSW<0> to UCGSW<3> are supplied to the gates of the transistors, respectively, and the other ends of the transistors are connected to a node N13.

One ends of the NMOS transistors 157f<0> to 157f<3> are connected to CG0, CG1, CG2, and CG3, respectively, signals SEL<0> to SEL<3> are supplied to the gates of the transistors, respectively, and the other ends of the transistors are connected to a node N14.

<2-1-2-2> Operation of Selection Unit 157

Next, an operation of the selection unit 157 at the time of the block selecting operation will be described.

<2-1-2-2-1> When the Group Corresponding to the Decode Circuit is Selected

Descriptions will be made on the case where the group corresponding to the decode circuit 151 is selected. When the block selecting operation starts, the signal BLK_SEL becomes the "H" level as described above. Thus, the corresponding WLSW circuits go into an ON state.

When a selected block BLK<Y> in the group GP is good, the signals USEL<Y> and USGSW<Y> become the "L" level, and the signal SEL<Y> becomes the "H" level. Thus, the NMOS transistors 157e <Y> and 157d<Y> go into an OFF state, and the NMOS transistor 157f<Y> goes into an ON state. As a result, a voltage CGn is transferred to the word lines WL(BLK<Y>) related to the block BLK<Y>.

When the unselected blocks BLK<Y> in the group GP are good, the signals UCGSW and USEL<Y> become the "H" level, and the signal SEL<Y> becomes the "L" level. Thus, the NMOS transistors 157d<Y> and 157e<Y> go into an ON state, and the NMOS transistor 157f<Y> goes into an OFF state. As a result, the voltage UCG is transferred to the word lines WL(BLK<Y>) related to the blocks BLK<Y>.

When the unselected blocks BLK<Y> in the group GP are bad, the signal USEL<Y> becomes the "H" level, and the signals UCGSW<Y> and SEL<Y> become the "L" level. Thus, the NMOS transistors 157e<Y> and 157f<Y> go into an OFF state. As a result, the word lines WL(BLK<Y>) related to the block BLK<Y> are brought into the electrically floating state.

<2-1-2-2-2> When the Group Corresponding to the Decode Circuit is Not Selected

Descriptions will be made on the case where the group corresponding to the decode circuit 151 is not selected. When the block selecting operation starts, the signal BLK_SEL becomes the "L" level as described above. Thus, the corresponding WLSW circuits go into an OFF state. As a result, the word lines WL of the unselected group are brought into the electrically floating state.

The configuration of the decode circuit 151<0> has been described, and the decode circuits 151<1> to 151<m> have the same configuration as that of the decode circuit 151<0>.

<2-2> Effects

According to the above-described embodiment, the same effects as those of the first embodiment may be obtained. Further, since the pre-decode method is used, it is possible to provide the circuit area in the peripheral circuit portion so as to prevent the compression of the local circuit area.

In the present embodiment, another example of the selection unit 157 has been described. However, the selection unit 157 may have any other configuration. That is, the selection unit 157 may have a configuration in which when the group corresponding to the decode circuit 151 is selected, and the blocks in the group include a bad block, the bad block is brought into the electrically floating state.

<3> Third Embodiment

A third embodiment will be described. In the third embodiment, still another example of the selection unit 157 will be described. In addition, the basic configuration and operation of the memory device according to the third embodiment are the same as those of the memory device according to the first embodiment. Thus, descriptions of the matters that have been described in the first embodiment and may be easily conceived from the first embodiment will be omitted.

In the semiconductor memory device according to the third embodiment, when the group corresponding to the decode circuit 151 is selected, and a bad block is present in the group GP, a voltage UCGX (which is a voltage for a bad block) is transferred to the bad block. A method of transferring the voltage UCGX to the bad block is described below. While the voltage UCGX is required to be lower than, for example, the voltage UCG and not to affect the operation of selecting a good block, the voltage UCGX may otherwise be arbitrarily set.

<3-1> Row Decoder

A configuration of the row decoder 150 and an operation of the row decoder 150 at the time of the block selecting operation will be described using FIGS. 13 to 14.

<3-1-1> Third Circuit 156

Figure 13:
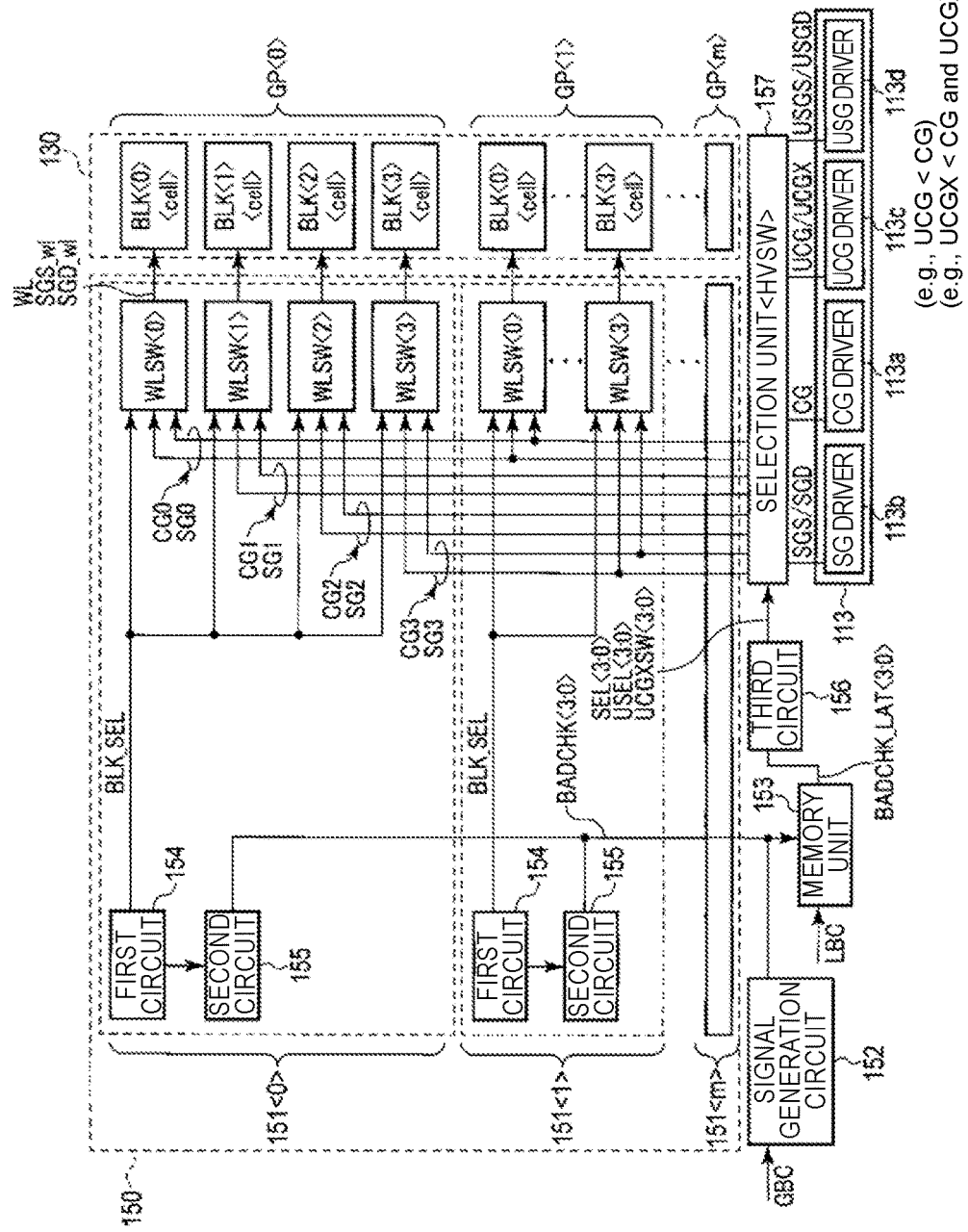
FIG. 13 is a view illustrating still another configuration of the row decoder.
Figure 14:
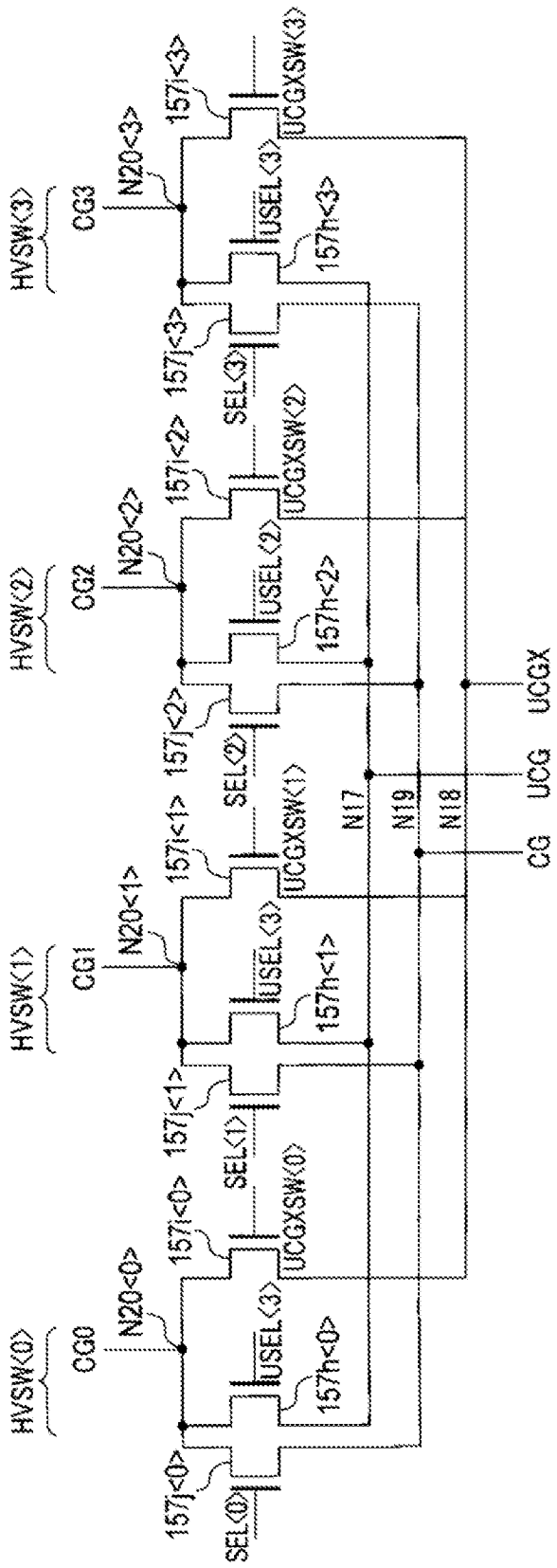
FIG. 14 is a view illustrating still another configuration of the selection unit.

As illustrated in FIG. 13, the third circuit 156 generates the signals UCGXSW<3:0>, SEL<3:0>, and USEL<3:0> based on the signal EN, ADDRESS, and the signals BADCHK_LAT<0> to BADCHK_LAT<3>.

Specifically, when a block BLK<Y> in the specific selected group GP is selected, and the signal BADCHK_LAT<Y> is at the "H" level (i.e., the block BLK<Y> is good), the third circuit 156 sets the signal SEL<Y> to the "H" level, and the signals UCGXSW<Y> and USEL<Y> to the "L" level.

In the unselected blocks<Y> in the specific selected group GP, when the signal BADCHK_LAT<Y> is at the "H" level (i.e., the block BLK<Y> is good), the third circuit 156 sets the signal SEL<Y> to the "L" level, the signal UCGXSW<Y> to the "L" level, and the signal USEL<Y> to the "H" level.

Further, in the unselected blocks<Y> in the specific selected group GP, when the signal BADCHK_LAT<Y> is at the "L" level (i.e., the block BLK<Y> is bad), the third circuit 156 sets the signals SEL<Y> and USEL<Y> to the "L" level, and the signal UCGXSW<Y> to the "H" level.

<3-1-2> Selection Unit 157

<3-1-2-1> Configuration of Selection Unit 157

Next, the selection unit 157 will be described using FIG. 14. Here, for the sake of simplification, descriptions will be made focusing on the selection unit HVSW related to the word lines WL.

Each of the selection units HVSW<0> to HVSW<3> includes NMOS transistors 157$h$, 157$i$, and 157$j$.

One ends of the NMOS transistors 157$h$<0> to 157$h$<3> are connected to CG0, CG1, CG2, and CG3, respectively, the signals USEL<0> to USEL<3> are supplied to the gates of the transistors, respectively, and the drains of the transistors are connected to a node N17.

One ends of the NMOS transistors 157$i$<0> to 157$i$<3> are connected to CG0, CG1, CG2, and CG3, respectively, the signals UCGXSW<0> to UCGXSW<3> are supplied to the gates of the transistors, respectively, and the other ends of the transistors are connected to a node N18.

One ends of the NMOS transistors 157$j$<0> to 157$j$<3> are connected to CG0, CG1, CG2, and CG3, respectively, the signals SEL<0> to SEL<3> are supplied to the gates of the transistors, respectively, and the other ends of the transistors are connected to a node N19.

<3-1-2-2> Operation of Selection Unit 157

Next, an operation of the selection unit 157 at the time of the block selecting operation will be described.

<3-1-2-2-1> When the Group Corresponding to the Decode Circuit is Selected

Descriptions will be made on the case where the group corresponding to the decode circuit 151 is selected. When the block selecting operation starts, the signal BLK_SEL becomes the "H" level as described above. Thus, the corresponding WLSW circuits go into an ON state.

When a selected block BLK<Y> in the selected group GP is good, the signals USEL<Y> and UCGXSW<Y> become the "L" level, and the signal SEL<Y> becomes the "H" level. Thus, the NMOS transistors 157$h$<Y> and 157$i$<Y> go into an OFF state, and the NMOS transistor 157$j$<Y> goes into an ON state. As a result, the voltage CGn is transferred to the word lines WL(BLK<Y>) related to the block BLK<Y>.

When the unselected blocks BLK<Y> in the selected group GP are good, the signal USEL<Y> becomes the "H" level, and the signals SEL<Y> and UCGXSW<Y> become the "L" level. Thus, the NMOS transistor 157$h$<Y> goes into an ON state, and the NMOS transistors 157$i$<Y> and 157$j$<Y> go into an OFF state. As a result, the voltage UCG is transferred to the word lines WL(BLK<Y>) related to the blocks BLK<Y>.

When the unselected blocks BLK<Y> in the selected group GP are bad, the signal UCGXSW<Y> becomes the "H" level, and the signals USEL<Y> and SEL<Y> become the "L" level. Thus, the NMOS transistor 157$i$<Y> goes into an ON state, and the NMOS transistors 157$h$<Y> and 157$j$<Y> go into an OFF state. As a result, the voltage UCGX is transferred to the word lines WL (BLK<Y>) related to the blocks BLK<Y>.

<3-1-2-2-2> When the Group Corresponding to the Decode Circuit is Not Selected

Descriptions will be made on the case where the group corresponding to the decode circuit 151 is not selected. When the block selecting operation starts, the signal BLK_SEL becomes the "L" level as described above. Thus, the corresponding WLSW circuits go into an OFF state. As a result, the word lines WL of the unselected group are brought into the electrically floating state.

The configuration of the decode circuit 151<0> has been described, and the decode circuits 151<1> to 151<$m$> have the same configuration as that of the decode circuit 151<0>.

<3-2> Effects

According to the above-described embodiment, when the group corresponding to the decode circuit 151 is selected, and a bad block is present in the group, the semiconductor memory device transfers the voltage UCGX to the bad block. Thus, the same effects as those of the first embodiment may be obtained.

In the present embodiment, still another example of the selection unit 157 has been described. However, the selection unit 157 may have any other configuration. That is, the selection unit 157 may have a configuration in which when the group corresponding to the decode circuit 151 is selected, and a bad block is present in the group, the voltage UCGX is transferred to the bad block.

<4> Fourth Embodiment

A fourth embodiment will be described. In the fourth embodiment, another example of the second circuit will be described. In addition, the basic configuration and operation of the memory device according to the fourth embodiment are the same as those of the memory device according to the first embodiment. Thus, descriptions of the matters that have been described in the first embodiment and may be easily conceived from the first embodiment will be omitted.

<4-1> Second Circuit 155

<4-1-1> Configuration of Second Circuit 155

Next, the second circuit 155 will be described. In the second circuit 155 according to the fourth embodiment, the positions of the NMOS transistors 155$a$<Y> and 155$b$<Y> of the second circuit 155 according to the first embodiment are exchanged.

Figure 15:
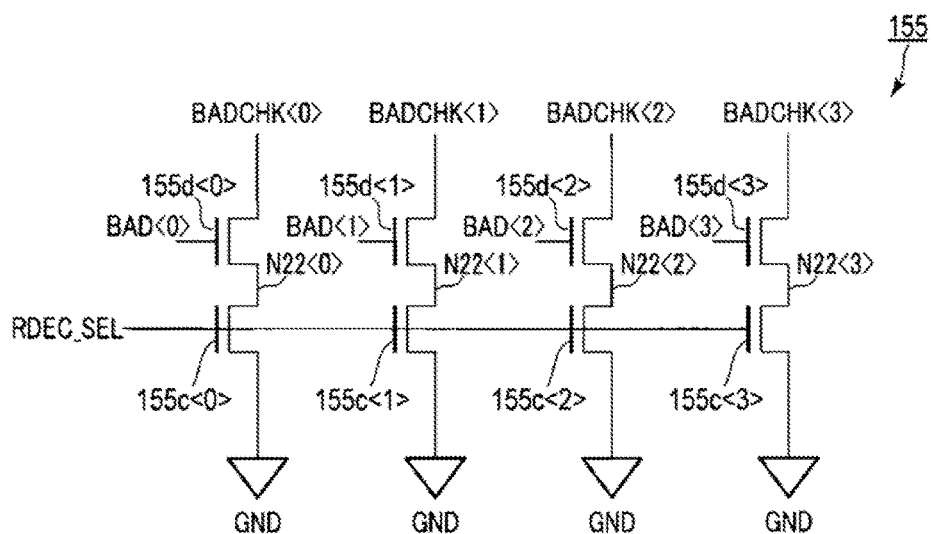
FIG. 15 is a view illustrating another configuration of the second circuit.

Specifically, as illustrated in FIG. 15, the second circuit 155 includes NMOS transistors 155$c$<Y> and 155$d$<Y> corresponding to a block BLK<Y>. Specifically, as illustrated in FIG. 6, for example, the second circuit 155 includes NMOS transistors 155$c$<0> to 155$c$<3> and 155$d$<0> to 155$d$<3> corresponding to the blocks BLK<0> to BLK<3>, respectively.

The NMOS transistors 155$c$<0> to 155$c$<3> discharge nodes N22<0> to N22<3>, respectively, based on the signal RDEC_SEL. The NMOS transistors 155$d$<0> to 155$d$<3> connect the nodes N22<0> to N22<3> to the signal generation circuit 152 based on the bad information (BAD<0> to BAD<3>).

<4-1-2> Operation of Second Circuit 155

The basic operation of the second circuit 155 according to the fourth embodiment is similar to that of the second circuit 155 according to the first embodiment.

<4-2> Effects

According to the above-described embodiment, the same effects as those of the first embodiment may be obtained.

Further, the second circuit 155 of the fourth embodiment may be replaced with the second circuit 155 of the first to third embodiments.

<5> Modifications and Others

In each of the above-described embodiments, the voltage to be transferred to the word lines WL of a bad block in the selected group GP is controlled based on the bad information stored in the first circuit 154. However, instead of the bad information stored in the first circuit 154, good information may be used. For example, in this case, the NMOS transistor 155a or 155d of the second circuit 155 sets the signal BADCHK (and the signal BADCHK_LAT) to the "L" level based on the good information. Then, when the signal BADCHK_LAT is at the "H" level, the third circuit 156 may determine that a target block is bad and generate each signal.

In the signal generation circuit 152 of the embodiments, the PMOS transistors are charged with the VRD at the initial stage, and the second circuit 155 performs a control (such that the NMOS transistors go into an ON state and are discharged for a bad block, and go into an OFF state for a good block) by the bad information in the first circuit 154. In this way, the voltage to be transferred to the word lines WL of a bad block within the selected group GP is controlled. However, the second circuit may be configured with the PMOS transistors. In this case, in the signal generation circuit 152, the NMOS transistors are discharged at the initial stage, and the second circuit 155 performs a control (such that the PMOS transistors go into an ON state and are charged for a bad block, and go into an OFF state for a good block) by the bad information in the first circuit 154, so that the voltage to be transferred to the word lines WL of a bad block within the selected group GP may be controlled.

As to the polarity of the signal for identifying a bad or good block, a control circuit suitable for any of the "H" and "L" levels may be used. Further, any of the bad/good information in the first circuit may be used.

The read of the bad information may be performed in parallel or in series for a plurality of blocks.

Further, the read of the bad information is implemented by a common read operation or a special read operation (e.g., refresh read) for ensuring cell reliability.

In each of the above-described embodiments (where the voltage values or time are merely exemplary), (1) in the read operation,
the voltage to be applied to selected word lines for a read operation of a level A is, for example, 0 V to 0.55 V. The voltage is not limited thereto and may be any one of 0.1 V to 0.24 V, 0.21 V to 0.31 V, 0.31 V to 0.4 V, 0.4 V to 0.5 V, and 0.5 V to 0.55 V.

The voltage to be applied to selected word lines for a read operation of a level B is, for example, 1.5 V to 2.3 V. The voltage is not limited thereto and may be any one of 1.65 V to 1.8 V, 1.8 V to 1.95 V, 1.95 V to 2.1V, and 2.1V to 2.3.

The voltage to be applied to selected word lines for a read operation of a level C is, for example, 3.0 V to 4.0 V. The voltage is not limited thereto and may be any one of 3.0 V to 3.2 V, 3.2 V to 3.4 V, 3.4 V to 3.5 V, 3.5 V to 3.6 V, and 3.6 V to 4.0 V.

Time (tR) for the read operation may be, for example, 25 µs to 38 µs, 38 µs to 70 µs, or 70 µs to 80 µs.

(2) The write operation includes a program operation and a verification operation as described above. In the write operation, the voltage to be applied first to word lines selected at the time of the program operation is, for example, 13.7 V to 14.3 V. The voltage is not limited thereto and may be any one of, for example, 13.7 V to 14.0 V and 14.0 V to 14.6 V.

The voltage to be applied first to selected word lines when writing odd-numbered word lines and the voltage to be applied first to selected word lines when writing even-numbered word lines may be exchanged.

When the program operation is an incremental step pulse program (ISPP) method, the step-up voltage may be, for example, about 0.5 V.

The voltage to be applied to unselected word lines may be, for example, 6.0 V to 7.3 V. The voltage is not limited thereto and may be, for example, 7.3 V to 8.4 V or 6.0 V or lower.

The path voltage to be applied when unselected word lines are odd-numbered word lines and the path voltage to be applied when unselected word lines are even-numbered word lines may be exchanged.

Time (tProg) for the write operation may be, for example, 1,700 µs to 1,800 µs, 1,800 µs to 1,900 µs, or 1,900 µs to 2,000 µs.

(3) In the erase operation,
the voltage to be applied first to the well formed on a semiconductor substrate and having the above-described memory cells disposed thereon is 12 V to 13.6 V. The voltage is not limited thereto and may be, for example, 13.6 V to 14.8 V, 14.8 V to 19.0 V, 19.0 V to 19.8V or 19.8 V to 21 V.

Time (tErase) for the erase operation may be, for example, 3,000 µs to 4,000 µs, 4,000 µs to 5,000 µs, or 4,000 µs to 9,000 µs.

(4) The structure of the memory cells (an example of the 2D NAND) has a charge stacked layer disposed on a semiconductor substrate (a silicon substrate) via a tunnel insulating film having a film thickness of 4 nm to 10 nm. The charge stacked layer may have a stacked structure of an insulating film such as SiN or SiON having a film thickness of 2 nm to 3 nm, and polysilicon having a film thickness of 3 nm to 8 nm. A metal such as Ru may be added to the polysilicon. An insulating film is provided on the charge stacked layer. The insulating film has a silicon oxide film having a film thickness of 4 nm to 10 nm sandwiched between a lower layer High-k film having a thickness of 3 nm to 10 nm and an upper layer High-k film having a film thickness of 3 nm to 10 nm. The High-k film may be, for example, HfO. In addition, the film thickness of the silicon oxide film may be made thicker than the film thickness of the High-k film. On the insulating film, a control electrode having a film thickness of 30 nm to 70 nm is formed via a material having a film thickness of 3 nm to 10 nm. Here, such a material is a metal oxide film such as TaO or a metal nitride film such as TaN. As the control electrode, W or the like may be used.

An air gap may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of blocks of memory cells, including first, second, and third blocks of a first group of blocks and fourth, fifth, and sixth blocks of a second group of blocks;
a plurality of word lines for each of the blocks;
a first decode circuit for the first group; and
a second decode circuit for the second group,
wherein when the first block is selected, the second and third blocks are unselected, and the third block is a bad block,
the first decode circuit transfers a first voltage to word lines of the first block, transfers a second voltage lower than the first voltage to word lines of the second block, and transfers a third voltage different from the second voltage and less than the first voltage to word lines of the third block, and
the second decode circuit causes words lines of the fourth block, the fifth block, and the sixth block to go into an electrically floating state, and
wherein the word lines of the third block are connected to a first line at the first voltage through a first switch, a second line at the second voltage through a second switch, and a third line at the third voltage through a third switch, the first switch being turned off as a first result of the third block being unselected, and the second switch being turned off and the third switch being turned on as a second result of the third block being a bad block.

2. The semiconductor memory device according to claim 1, wherein the first decode circuit is configured to store bad block information for each of the blocks in the first group.

3. The semiconductor memory device according to claim 1, wherein
the first decode circuit includes a first transistor between the first line at the first voltage and the word lines of the first block, a second transistor between the second line at the second voltage and the word lines of the second block, and a third transistor between the third line at the third voltage and the word lines of the third block, and
gates of the first, second, and third transistors receive a common block selection signal, respectively.

4. The semiconductor memory device according to claim 3, wherein the first decode circuit includes a block selection signal generation circuit configured to generate the common block selection signal at a first level if one of the blocks in the first group is selected and the selected block is not a bad block and to generate the common block selection signal at a second level if the selected block is a bad block.

5. A semiconductor memory device comprising:
a plurality of blocks of memory cells, including first, second, and third blocks of a first group of blocks and fourth, fifth, and sixth blocks of a second group of blocks;
a plurality of word lines for each of the blocks;
a first decode circuit for the first group; and
a second decode circuit for the second group,
wherein when the first block is selected,
the first decode circuit transfers a first voltage to word lines of the first block, transfers a second voltage lower than the first voltage to word lines of the second block, and transfers a third voltage different from the second voltage and less than the first voltage to word lines of the third block, and
the second decode circuit causes words lines of the fourth block, the fifth block, and the sixth block to go into an electrically floating state, and
wherein the first decode circuit includes a first transistor between a first line at the first voltage and the word lines of the first block, a second transistor between a second line at the second voltage and the word lines of the second block, and a third transistor between a third line at the third voltage and the word lines of the third block, and
gates of the first, second, and third transistors receive a common block selection signal, respectively.

6. The semiconductor memory device according to claim 5, wherein the first decode circuit includes a block selection signal generation circuit configured to generate the common block selection signal at a first level if one of the blocks in the first group is selected and the selected block is not a bad block and to generate the common block selection signal at a second level if the selected block is a bad block.

* * * * *